United States Patent
Kiefer et al.

(10) Patent No.: US 6,750,650 B2
(45) Date of Patent: Jun. 15, 2004

(54) MAGNETIC RESONANCE TOMOGRAPHY APPARATUS AND METHOD FOR SEPARATING FAT AND WATER IMAGES BY CORRECTION OF PHASE VALUES DEPENDENT ON A NOISE PHASE

(75) Inventors: Berthold Kiefer, Erlangen (DE); Ralf Loeffler, Wuerzburg (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/188,212

(22) Filed: Jul. 2, 2002

(65) Prior Publication Data

US 2003/0062900 A1 Apr. 3, 2003

(30) Foreign Application Priority Data

Jul. 4, 2001 (DE) .......................... 101 32 274

(51) Int. Cl.$^7$ ............................. G01V 3/00
(52) U.S. Cl. ...................... 324/309; 324/307
(58) Field of Search ............... 324/309, 307, 324/311, 320, 318, 319, 322; 128/653.2; 600/410

(56) References Cited

U.S. PATENT DOCUMENTS

| 5,162,737 A | 11/1992 | Nozokido et al. | ......... 324/320 |
|---|---|---|---|
| 5,614,827 A | 3/1997 | Heid | .......... 324/318 |
| 5,617,028 A | 4/1997 | Meyer et al. | ............ 324/320 |
| 5,823,959 A | 10/1998 | Rasche | .......... 600/410 |

FOREIGN PATENT DOCUMENTS

| DE | PS 198 44 420 | 4/2000 |
| EP | 0 845 684 | 6/1998 |
| EP | 0 745 865 | * 12/1998 |
| GB | 2 320 576 | * 12/1997 |
| GB | 2 320 576 | 6/1998 |
| WO | WO 95/30908 | 11/1995 |

OTHER PUBLICATIONS

Zijl et al Journal of Magnetic resonance Series A, 111, 203–207, 1994.*
"Three–Point Dixon Technique for True Water/Fat Decomposition with $B_0$ Inhomogeneity Correction," Glover et al. Magnetic Resonance in Medicine, vol. 18, (1991) pp. 371–383.

* cited by examiner

Primary Examiner—Brij B Shrivastav
(74) Attorney, Agent, or Firm—Schiff Hardin LLP

(57) ABSTRACT

In a magnetic resonance tomography apparatus and a method for the operation thereof the acquisition of pure fat and water images is enabled, taking the basic field inhomogeneities into consideration, by utilizing the data that are obtained about the relevant measurement volume by means of a conventional 3D field measurement for the correction of the residual phase offset of the imaging data. The imaging data are preferably acquired on the basis of the 2-point Dixon method.

21 Claims, 6 Drawing Sheets

FIG 2A
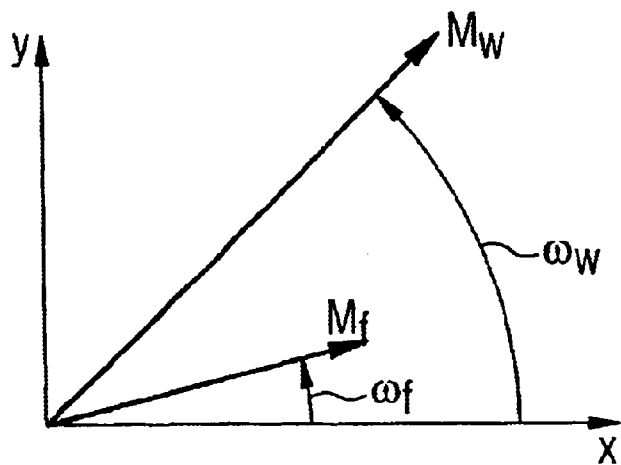
FIG 2B
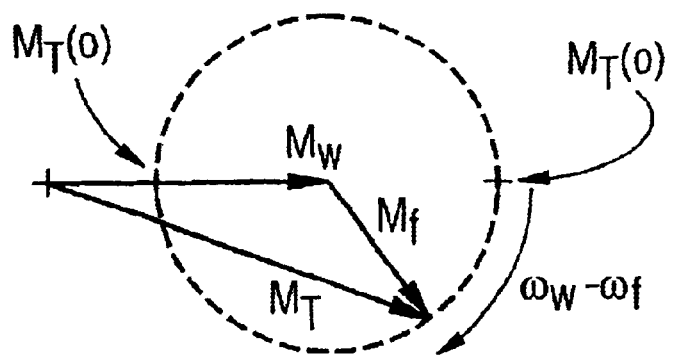
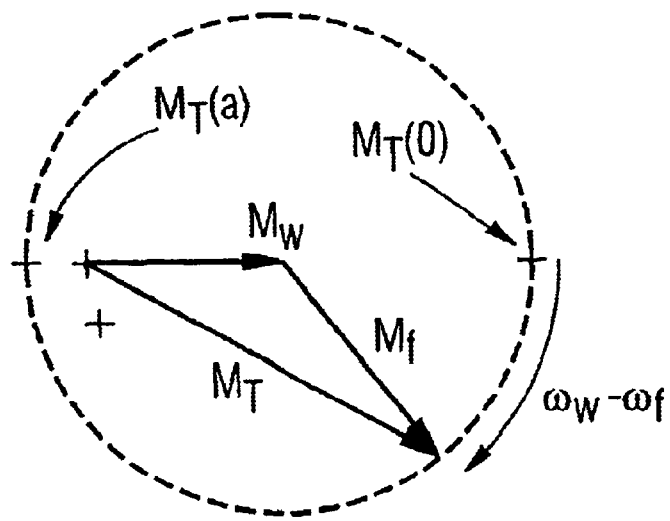

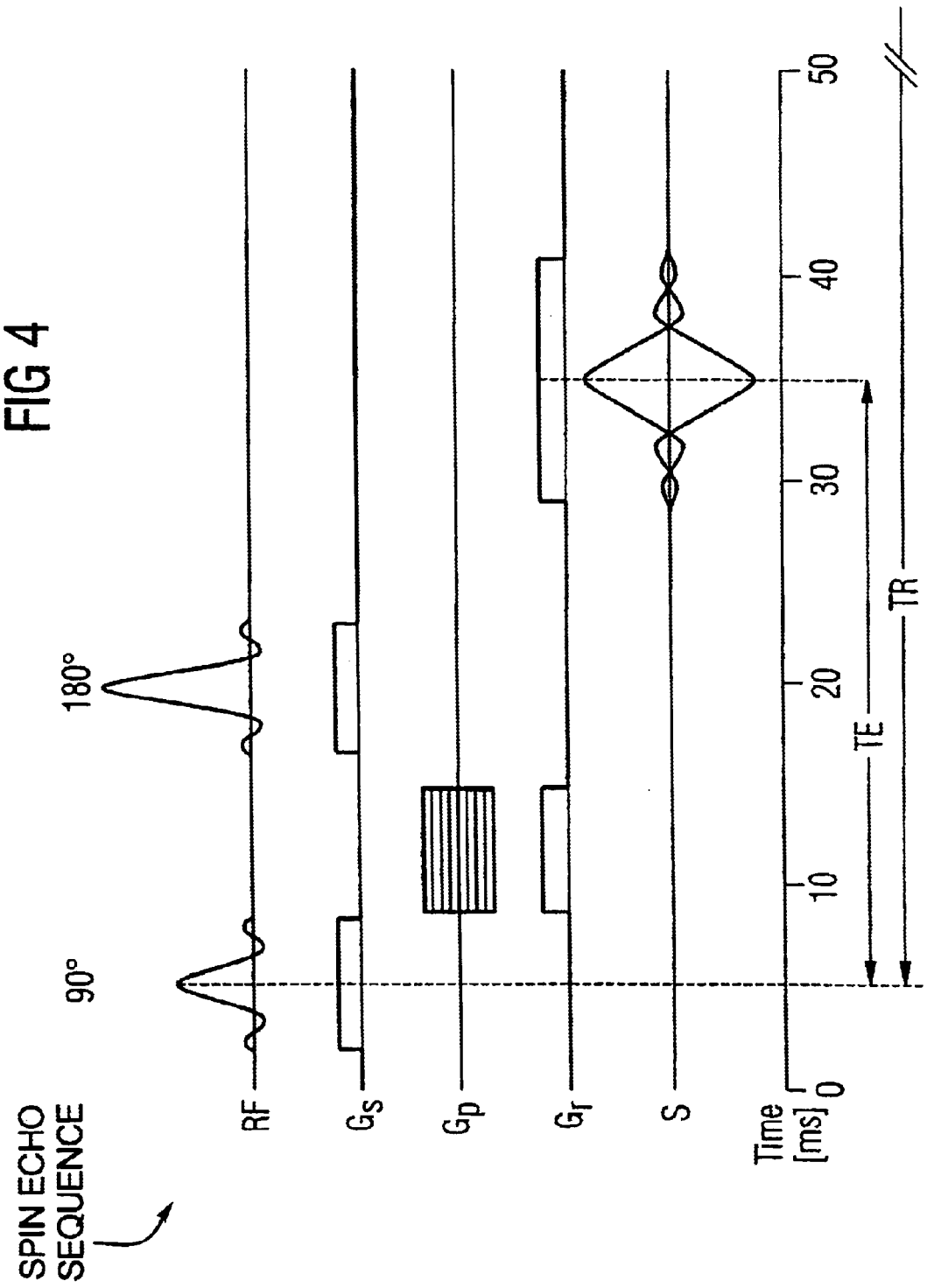

MAGNETIC RESONANCE TOMOGRAPHY APPARATUS AND METHOD FOR SEPARATING FAT AND WATER IMAGES BY CORRECTION OF PHASE VALUES DEPENDENT ON A NOISE PHASE

BACKGROUND OF THE INVENTION

1. Field of the Invention

The present invention is directed in general to magnetic resonance tomography (MRT) as employed in medicine for examining patients. In particular, the present invention is directed to a magnetic resonance apparatus as well as to a method for the operation thereof of the type wherein a 3D field map, for example according to German PS 198 44 420, is employed in combination with the known two-point Dixon method.

2. Description of the Prior Art

Magnetic resonance tomography is a tomographic method for medical diagnostics that is mainly distinguished by a high contrast resolution capability. Due to the excellent presentation of soft tissue, magnetic resonance tomography has developed into a method that is often superior to x-ray computed tomography. Magnetic resonance tomography is currently based on the application of spin echo sequences and gradient echo sequences that enable an excellent image quality with measuring times on the order of magnitude of minutes.

In the presentation of the tissue of patients, however, artifacts that arise from the influence of the chemical shift occur at the boundary layers between fat and water. The phenomenon referred to as chemical shift is the property that the resonant frequency shifts slightly proportional to the field strength dependent on the type of chemical bond in which the nucleus is situated. Due to its concentration in the human body, primarily hydrogen nuclei of free water and of fat contribute to the image. Their relative resonant frequency difference amounts to approximately 3 ppm (parts per million). As a result, a modulation of the signal intensity dependent on the echo time TE occurs given the employment of spin echo sequences and gradient echo sequences.

Such artifacts must be avoided since they can lead to an incorrect diagnosis. It is therefore a problem which persists in the field of magnetic resonance tomography to provide a magnetic resonance tomography apparatus and a method for the operation thereof wherein the artifacts due to the chemical shift between a first spin ensemble, for example water, and a second spin ensemble, for example fat, are diminished or avoided.

The original publication of W. T. Dixon presented a method that achieves a separation of the fat and water images with two echoes (gradient or spin echoes). This shall be described in brief below.

Immediately after a 90° excitation pulse is emitted into a subject in, the magnetization vector of the water protons MW and the magnetization vector of the fat protons Mf point in the same direction. This condition, however, does not persist since the water protons precess 3 to 4 ppm faster than the fat protons in the uniform magnetic field. The manner by which the magnetization of the water protons and that of the fat protons disperse over time can be seen in the laboratory system (FIG. 2a). This difference amounts to approximately 50 Hz given 0.35 T. As shown in FIG. 2b, the total magnetization MT is the vector sum of water and fat magnetization. FIG. 2a refers to a reference system that rotates with the frequency of the water protons.

FIG. 2c shows that the total magnetization $M_T$ initially exhibits a maximum when the water and the fat magnetization point in the same direction but soon passes through a minimum when the water magnetization and the fat magnetization are anti-parallel (oppositely directed).

$$t = \frac{1}{2(v_w - v_f)} = a$$

wherein t is time, $v_f$ is the fat proton frequency and $v_w$ is the water proton frequency. The time a is of great significance since the exposure of an imaging sequence at time t=a supplies an image in which the brightness of the pixels is dependent on the difference between fat magnetization and water magnetization. An exposure at t=O1, i.e. when fat and water magnetization are directed parallel, yields an image wherein the sum of fat magnetization and water magnetization is presented.

The sum of and the difference between the two images is of critical significance: the sum yields a water image, the difference yields a fat image.

The method that has just been presented has, however, a great disadvantage: it assumes that the basic field $B_0$ is absolutely homogeneous. Inhomogeneities of the basic field that in fact exist lead do not allow the components to be unambiguously separated.

The 3-point Dixon method was proposed as a possible expansion, this being described by G. H. Glover and E. Schneider in the article "Three-Point Dixon Technique for True Water/Fat Decomposition with $B_0$ Inhomogeneity Correction", Magnetic Resonance in Medicine, Vol. 18, pp. 371–383, 1991, and being currently widely applied, however, problems continue to exist: Three instead of two images with different phase shift must be registered, which significantly lengthens the measuring time and limits the application of the sequences. Moreover, a phase unwrap of the respective measurement matrix must be implemented, this itself being affected by problems (phase unwrapping of 2D data is not trivial).

SUMMARY OF THE INVENTION

It is an object of the present invention to provide a magnetic resonance tomography apparatus and a method for the operation thereof that enable the acquisition of pure fat and water images in a simpler way, taking the basic field inhomogeneities into consideration.

This object is inventively achieved in an apparatus for processing and presentation of a nuclear magnetic resonance tomography measured image, having a radio-frequency system with which a 3D field measurement is implemented for obtaining 3D field data with respect to the inhomogeneities of the basic field. A processing system reconstructs an image from the acquired image data and which interpolates 3D field data over the correspondingly selected slice obtained with the radio-frequency system, and corrects the phase of the imaging data on the basis of the residual phase offset data respectively obtained by means of the interpolation.

Further, shim coils are advantageously provided that are driven by a shim power supply in order to homogenize the $B_0$-field for the slices selected for the following imaging measurement—preferably over the entire homogeneity volume—by suitable application of current to the shim coils. The homogenization is effective to a low order, preferably first order, of the basic field.

The processing system calculates the current for the shim coils on the basis of first 3D field data obtained with the radio-frequency system.

Given a corresponding current applied to the shim coils, the radio-frequency system picks up a new basic field that is non-uniform at a higher order by means of a renewed 3D field measurement, and the processing system interpolates the second 3D field data obtained in this way for a basic field that is non-uniform at a higher order and employs these for the phase correction of the imaging data.

The processing system computationally corrects the first 3D field dataset on the basis of the calculated applied current and the characteristics of the shim coils, and employs the second 3D field data obtained in this way for a basic field that is non-uniform in a higher order for the phase correction of the imaging data.

By means of a spin echo sequence or by means of a gradient echo sequence, further, the radio-frequency system can implement a number of measurements having different relative phase positions of the spin ensembles relative to one another.

The relative phase of the spins of the first and the second spin ensembles is usually different.

In the case of two echoes, the respective spins of the first and the second spin ensembles are advantageously in phase in the first measurement and anti-phase in the second measurement.

Further, the processing system can generate a pure image of the first or of the second spin ensemble by means of the addition and/or subtraction of the first and second datasets.

The first spin ensemble represents water and the second spin ensemble represents fat.

The processing system can be formed by an image computer and a system computer.

The present invention also is directed to a method for the operation of a magnetic resonance tomography apparatus having the following steps:

3D field measurement over a measurement volume, preferably over the entire homogeneity volume;

obtaining 3D field data with respect to the inhomogeneities of the basic field;

reconstructing an image from the acquired imaging data;

interpolating the 3D field data over the correspondingly selected slice;

and correcting the phase of the imaging data on the basis of the residual phase offset data respectively obtained by interpolation.

DESCRIPTION OF THE DRAWINGS

FIG. 2a illustrates the transverse magnetization component of fat and water after a 90° pulse in a laboratory system.

FIG. 2b illustrates the situation in the rotating reference system.

FIG. 4 illustrates a spin echo sequence.

DESCRIPTION OF THE PREFERRED EMBODIMENTS

Figure 1:
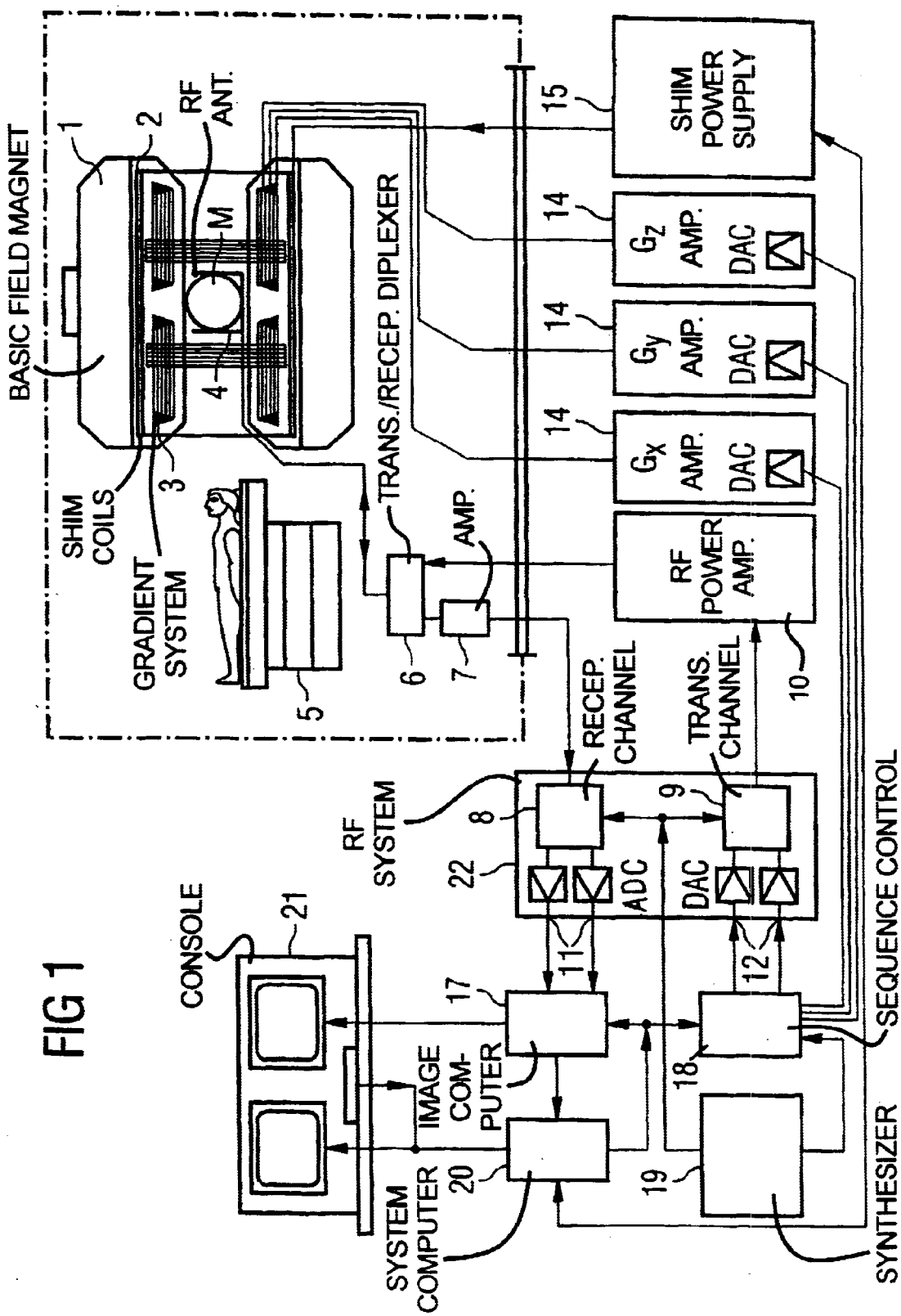
FIG. 1 is a schematic block diagram of a magnetic resonance tomography apparatus operable in accordance with the invention.

FIG. 1 is a schematic illustration of a magnetic resonance tomography apparatus for generating a magnetic resonance image of a subject according to the present invention. The basic structure of the magnetic resonance tomography apparatus corresponds to the basic structure of a conventional tomography apparatus, but processing is undertaken differently as described below. A basic field magnet 1 generates a time-invariant, strong magnetic field for polarization or alignment of the nuclear spins in the examination region of a subject such as, for example, a part of a human body to be examined. The high-homogeneity of the basic magnetic field required for the magnetic resonance measurement is defined in a spherical measurement volume M wherein the parts of the human body to be examined are introduced. For supporting the homogeneity demands and, in particular, for eliminating time-invariable influences, shim plates of ferromagnetic material are attached at suitable locations. Time-variable influences are eliminated by shim coils 2, that are driven by a shim power supply 15. The shim power supply 15 is connected to the system computer and is driven thereby.

A cylindrical gradient coil system 3 is introduced into the basic field magnet 1, this being composed of three partial windings. Each partial winding is supplied by an amplifier 14 with current for generating a linear gradient field in the respective direction of the Cartesian coordinate system. The first partial winding of the gradient field system 3 generates a gradient $G_x$ in the x-direction; the second partial winding generates a gradient $G_y$ in y-direction; and the third partial winding generates a gradient $G_z$ in the z-direction. Each amplifier 14 includes a digital-to-analog converter that is driven by a sequence control 18 for properly timed generation of gradient pulses.

A radio-frequency antenna 4 is located within the gradient field system 3, which converts the radio-frequency pulses supplies by a radio-frequency power amplifier 30 into an alternating magnetic field for exciting the nuclei and for aligning the nuclear spins of the subject to be examined, or of the region of the subject to be examined. The alternating field emanating from the precessing nuclear spins, i.e. the nuclear magnetic resonance echo signals usually produced by a pulse sequence composed of one or more radio-frequency pulses and of one or more gradient pulses, are converted into a voltage by the radio-frequency antenna 4. This voltage is supplied via an amplifier 7 to a radio-frequency reception channel 8 of a radio-frequency system 22. The radio-frequency system 22 also has a transmission channel 9 in which the radio-frequency pulses are generated for the aforementioned excitation. The respective radio-frequency pulses are represented digitally as a sequence of complex numbers on the basis of a pulse sequence in the sequence control 18 prescribed by the system computer 20. As a real part and an imaginary part, this number sequence is supplied via an input 12 to a digital-to-analog converter in the radio-frequency system 22 and is supplied therefrom to a transmission channel 9. In the transmission channel 9, a radio-frequency carrier signal whose base frequency corresponds to the resonant frequency of the nuclear spins in the measurement volume is modulated onto the pulse sequences. The output of the transmission channel 9 is applied in an RF power amplifier 10.

The switching from transmission mode to reception mode ensues via a transmission/reception diplexer 6. The radio-frequency antenna 4 emits the radio-frequency pulses for exciting the nuclear spins into the measurement volume M and samples resulting echo signals. The correspondingly acquired magnetic resonance signals are demodulated in phase-sensitive fashion in the reception channel 8 of the radio-frequency system 22 and are converted via an analogto-digital converter into a real part and an imaginary part of the measured signal. An image is reconstructed with an image computer 17 from the measured data acquired in this way. The administration of the measured data, of the image data and of the control programs ensues via the system computer 20. On the basis of a prescription with control programs, the sequence control 18 monitors the generation of the desired pulse sequences and the corresponding sampling of k-space. In particular, the sequence control 18 controls the properly timed switching of the gradients, the emission of the radio-frequency pulses with defined phase and amplitude as well as the reception of the magnetic resonance signals. The time base for the radio-frequency system 22 and the sequence control 18 is made available by a synthesizer. 19. The selection of corresponding control programs for generating a magnetic resonance image as well as the presentation of the generated magnetic resonance image ensues via a console 21 that has a keyboard as well as one or more picture screens.

FIG. 2a shows the transverse magnetization component of fat and water after a 90° pulse in the laboratory system. The volume element contains the water signal as well as the fat signal. Mw is the magnetization of the water; Mf is the magnetization of the fat; $\omega w$. and $\omega f$ are the Lamor frequencies of the water and fat protons ($\omega=2\pi\nu$).

FIG. 2b shows the situation in the rotating reference system: The total magnetization of water is greater than that of fat in the upper drawing, |Mw|>|Mf|. In the lower drawing, the total magnetization of fat is greater than that of water |Mf|>|Mw|.

The change of the total magnetization MT shown in FIG. 2b leads to a periodic change of the measured, overall magnetic resonance signal.

Figure 2C:
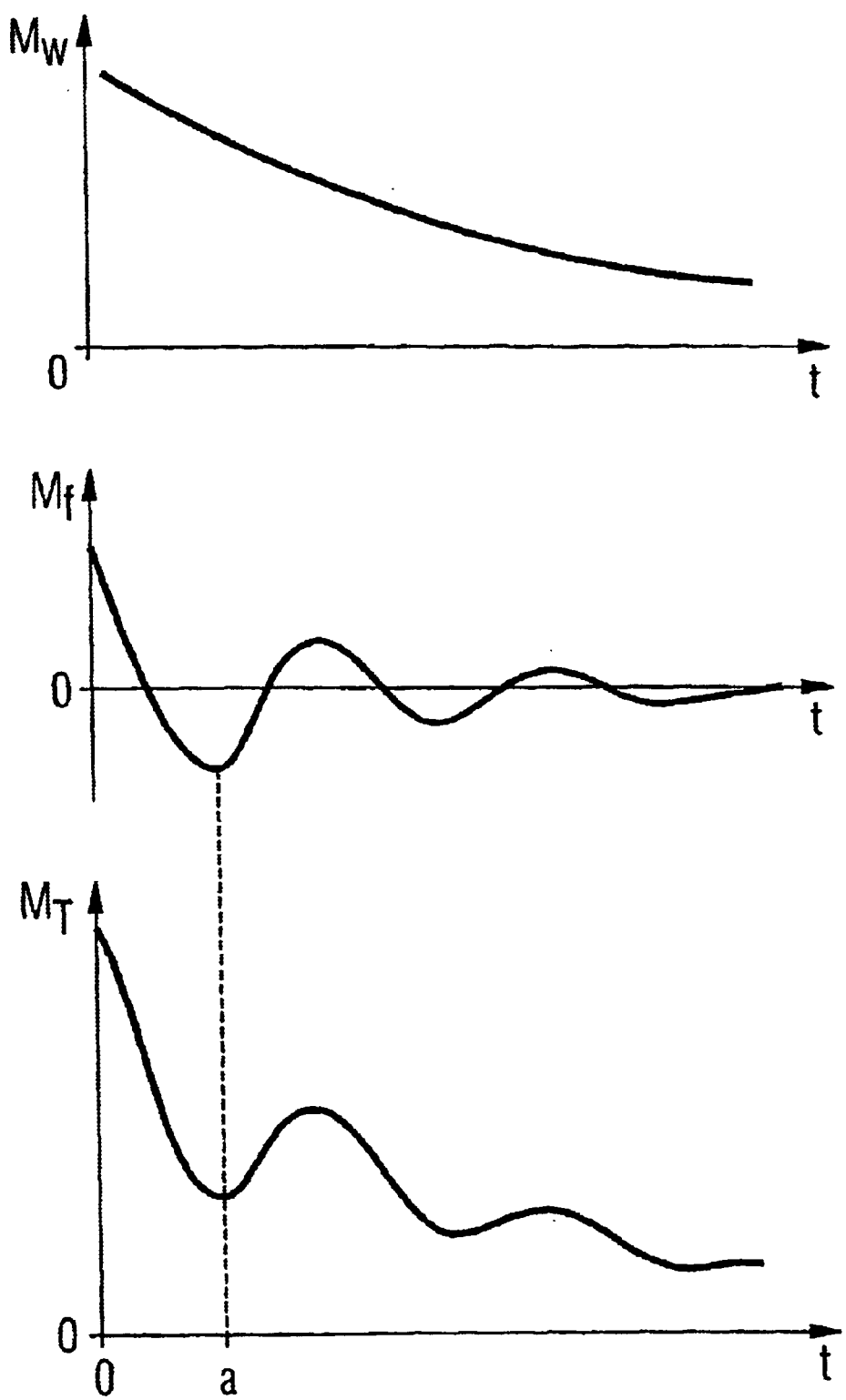
FIG. 2c illustrates the measured magnetization of water, fat as well as the superimposition of the two signals.

FIG. 2c shows the measured magnetization of water, fat as well as the overall magnetic resonance signal as a result of superimposition of the two signals.

According to the present invention, the magnetic resonance tomography apparatus can be operated with a gradient echo sequence or with a spin echo sequence.

Figure 3:
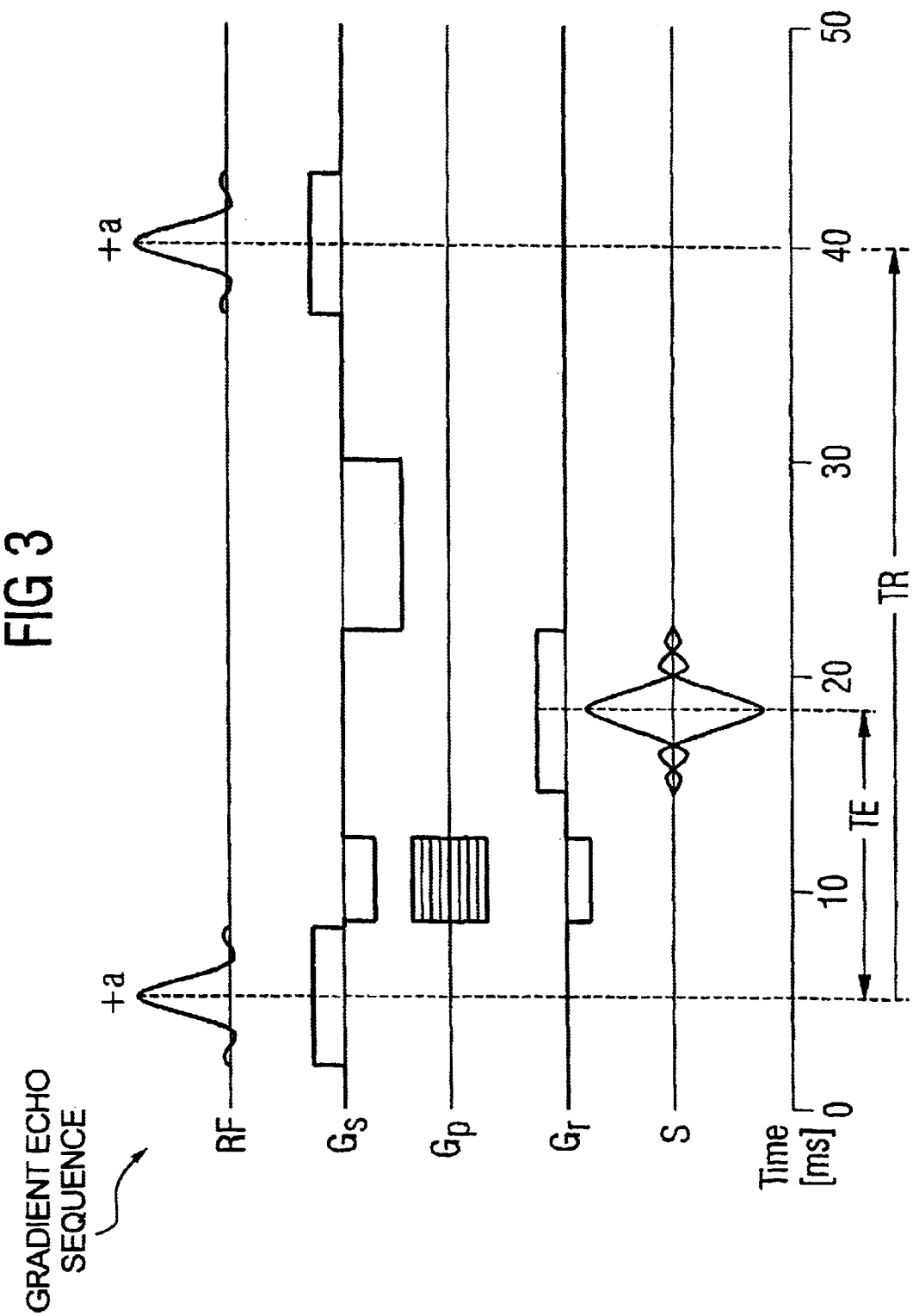
FIG. 3 illustrates a gradient echo sequence.

As shown in FIG. 3, a rephasing with respect to a slice selection gradient GS and a pre-dephasing with respect to a readout gradient GR occur given the gradient echo sequence. As a result of this gradient switching, the dephasing of the cross-magnetization produced by the gradients is compensated, so that an echo signal arises that is referred to as a gradient echo. The basic idea thus is that the transverse magnetization is restored after the signal readout and can be used for the next sequence execution. The echo signal in the gradient echo sequence is generated exclusively by gradient reversal of the frequency coding gradient.

The spin echo sequence is shown in FIG. 4. In the spin echo sequence, the 90° excitation pulse is followed by a dephasing frequency or readout gradient $G_r$. A phase shift remains after deactivation of the gradient $G_r$. A following 180° radio-frequency pulse causes an inversion of the phase shift. When the gradient $G_r$ is activated again in the same way as before, it has a rephasing effect.
The phase shift is thus reduced further in turns of amount. The refocusing of the nuclear spins has been accomplished at the time of the complete rephasing.

In both techniques, the repetition time TR is the time following which one RF excitation pulse follows the other. The echo signal follows after the time TE and can be acquired with readout gradient $G_r$.

In the phase coding, a gradient field is activated for a fixed time before the acquisition of the signal, the strength thereof being lowered (↓) or increased (↑) in steps by the one amount ΔGP at every sequence pass.

It should be noted that the system frequency usually is tuned to water, so that the water spins would not precess in the rotating reference system, i.e. would be "on-resonant", if the basic field $B_0$ were absolutely uniform. The precession angle βW of water would be 0, $\beta_w=0$. The other spin ensemble, fat, would precess in the rotating reference system of the water such that it would be aligned by the angle $\beta_F=180°$ after a time $\Delta T_E$ and thus anti-parallel to the water spin ensemble and would be aligned by an angle $\beta_F=360°$ after a time $2\Delta T_E$, i.e. parallel to the water spin ensemble.

Figure 5A:
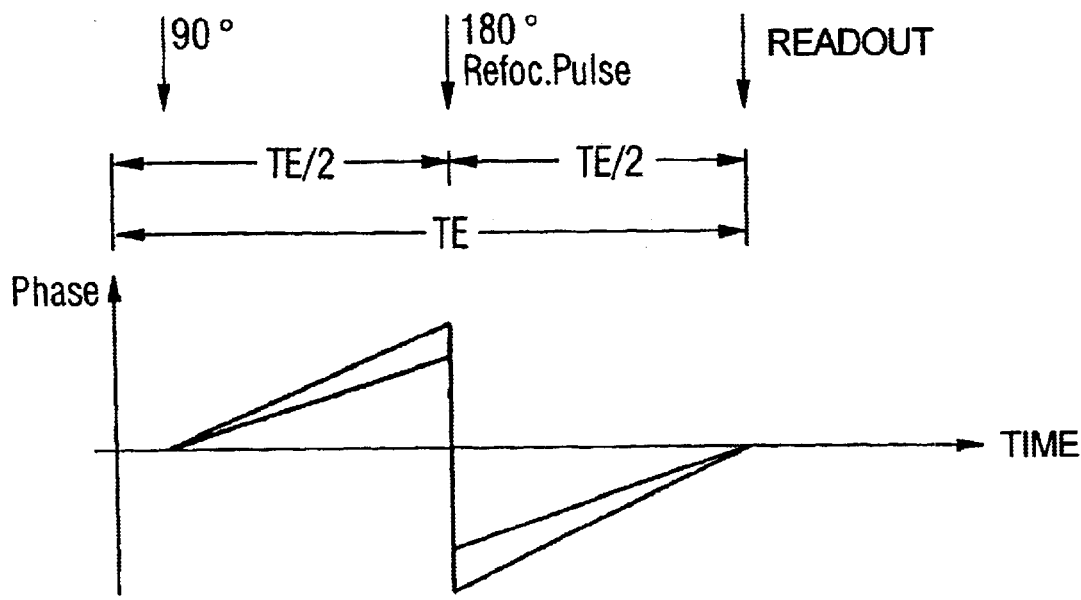
FIGS. 5a and 5b respectively show the phase evolution of the fat and water types in the presence of a static residual B-field offset with parallel and anti-parallel magnetization.

FIG. 5a shows the phase evolution of the fat and water types in the presence of a static residual B-field offset with parallel magnetization (fat and water "in-phase"). The readout time TE is selected such that fat and water are in phase.

Figure 5B:
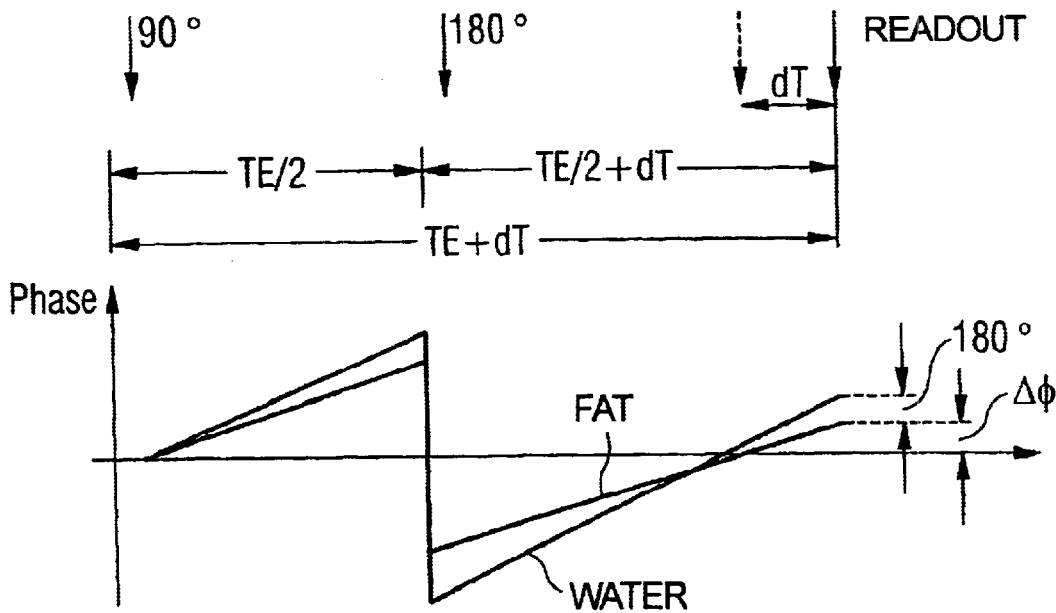

FIG. 5b shows the phase evolution of the fat and water types in the presence of a static residual B-field offset with anti-parallel magnetization (fat and water "opposed-phase"). The readout time is lengthened by a time dT such that fat and water exhibit a phase of 180° relative to one another after the time $T_E$+dT.

In fact, the basic field $B_0$ is not absolutely homogeneous but has location-dependent inhomogeneities ΔB that cause the water spin ensemble as well as the fat spin ensemble to additionally proceed through a residual phase offset Δφ with reference to water. The residual phase offset Δφ is proportional to the disturbance ΔB and must be taken into consideration only in the opposed phase in the spin echo sequence and in both phases in the gradient echo sequence.

This inventively ensues by implementing a 3D field measurement, preferably over the entire homogeneity volume before the actual measurement.

A 3D field dataset is obtained as a result from which, given the presence of shim coils 2, the shim currents can be calculated in order to already homogenize the basic field to a lower order in the correspondingly selected slices by applying a current to the shim coils 2. If no shim coils 2 are provided, this step is omitted, and the 3D field dataset can be directly employed for the phase correction of the image data.

It is thus proposed that a 3D field measurement (for example, according to German PS 198 44 420) be implemented over a large measurement volume (preferably over the entire homogeneity volume).

Using the data obtained from the 3D field measurement, shim currents are calculated, and are set by the shim coils 2 in order to homogenize the $B_0$-field—preferably to the first order—in the slices that are relevant for the following imaging measurement. Next, the dataset of the 3D field measurement is either computationally corrected (the characteristic of the shim coils 2 is known) or the dataset is re-registered by means of a further 3D field measurement in order to take the homogenization of the $B_0$-field that has already ensued at a lower order by means of the shim coils 2 into consideration. The corrected 3D field data or the newly registered 3D field data are interpolated with respect to the slices selected for the imaging. Subsequently, a correction of the phases of the imaging data is implemented on the basis of the residual phase offset data that were calculated from the 3D field data and that occurred because of the inhomogeneity of the B0-field.

Via the radio-frequency antenna 4, a number of measurements with different relative phase positions of the spin collectives relative to one another are then implemented with a spin echo sequence or with a gradient echo sequence.

The relative phase of the respective spins of the first and second spin ensembles thereby differ.

In the case of two echoes, the respective spins of the first and the second spin ensembles are in phase in the first measurement and are opposed in phase in the second measurement.

The image computer 17 or the system computer 20 produces a pure image of the first or of the second spin ensemble by means of the addition and/or subtraction of the first and second dataset.

A correction of the field with shim coils 2 is only possible with reasonable outlay to a lower order (usually, only the first order is corrected). The inhomogeneities of a higher order can be subsequently either measured by means of a renewed 3D shim measurement using previously applied shim currents, or calculated on the basis of the knowledge of the shim coil characteristic. In both ways, a 3D field dataset is obtained over a basic field that is still non-homogeneous to a higher order.

Since the 3D field dataset obtained by the 3D shim measurement for the basic field that is non-uniform to a higher order generally has a coarser resolution than the actual imaging measurement, the 3D field data are interpolated over the corresponding slice plane. Subsequently, the residual offset present due to the inhomogeneities are subtracted from the phases of the imaging data.

In the present invention, the inhomogeneities of the basic field can be identified spatially resolved with the assistance of the 3D shim measurement and, thus, it can be corrected for the residual phase offsets of the imaging data.

This method does not preclude the employment of 3-point or multi-point Dixon methods but can, ideally, supplements those methods.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance tomography apparatus comprising:
    a magnetic resonance scanner, including an RF system, operated by a control and processing system, for obtaining magnetic resonance image data for image reconstruction using a two-point Dixon technique, including phase values, from a slice, selected by said RF system, of an examination subject located in a basic magnetic field generated by said scanner, said basic magnetic field exhibiting field inhomogeneities;
    said control and processing system operating said radio-frequency system to make a 3D field measurement of said basic magnetic field in a one-time shimming procedure to obtain 3D field data representing said field inhomogeneities; and
    said control and processing system being supplied with said image data and said 3D field data for said slice, said control and processing system reconstructing an image of said slice using said two-point Dixon technique, including interpolating said 3D field data over said slice and identifying a residual phase offsets from said interpolation and correcting the phase values of said image data dependent on said residual phase offset data obtained in said one-time shimming procedure.

2. A magnetic resonance tomography apparatus as claimed in claim 1 wherein said scanner further comprises shim coils operated by a shim power supply for homogenizing said basic magnetic field at least in said slice to a low order dependent on a shim coil current supplied to said shim coils by said shim power supply.

3. A magnetic resonance tomography apparatus as claimed in claim 2 wherein said control and processing system calculates said shim coil current, and controls said shim power supply to generate said shim coil current, dependent on said 3D field data.

4. A magnetic resonance tomography apparatus as claimed in claim 3 wherein said 3D field data comprise first 3D field data and wherein, after homogenization to said low order of said basic magnetic field by said shim coils, said processing and control system operates said radio-frequency system to again make a 3D field measurement of said basic magnetic field to obtain second 3D field data said second 3D field data representing higher order inhomogeneity of said basic magnetic field, and wherein said processing and control system interpolates said image data using said second 3D field data to identify said residual phase offsets and to correct said phase values of said image data.

5. A magnetic resonance tomography apparatus as claimed in claim 3 wherein said 3D field data comprises first 3D field data and wherein said processing and control system corrects said first 3D field data by a calculation dependent on said shim coil current and dependent on characteristics of said shim coils to obtain second 3D field data representing a basic magnetic field having inhomogeneities of a higher order, and wherein said processing and control system corrects said phase values of said image data dependent on said second 3D field data.

6. A magnetic resonance tomography apparatus as claimed in claim 1 wherein said processing and control system operates said magnetic resonance scanner according to a pulse sequence selected from the group consisting of a spin echo sequence and a gradient echo sequence, to obtain magnetic resonance signals for different spin ensembles having respectively different relative phase values.

7. A magnetic resonance tomography apparatus as claimed in claim 6 wherein said processing and control system operates said magnetic resonance scanner to obtain said relative phase values of a first spin ensemble and a second spin ensemble.

8. A magnetic resonance tomography apparatus as claimed in claim 7 wherein said processing and control system operates said magnetic resonance scanner to obtain at least two echoes, with the spins of said first spin ensemble being inphase in one of said two echoes and being anti-phase in the other of said two echoes.

9. A magnetic resonance tomography apparatus as claimed in claim 8 wherein said processing and control system generates a pure image of said first spin ensemble in said slice by a mathematical operation performed on image data respectively from said two echoes selected from the group consisting of addition and subtraction.

10. A magnetic resonance tomography apparatus as claimed in claim 9 wherein said first spin ensemble represents water and said second spin ensemble represents fat.

11. A magnetic resonance tomography apparatus as claimed in claim 1 wherein said control and processing system comprises a system computer which operates said magnetic resonance scanner and an image computer which reconstructs said image.

12. A magnetic resonance imaging method comprising the steps of:
    from a control and processing system, operating a magnetic resonance scanner, including an RF system, for obtaining magnetic resonance image data for image reconstruction using a two-point Dixon technique, including phase values, from a slice, selected by said RF system, of an examination subject located in a basic magnetic field generated by said scanner, said basic magnetic field exhibiting field inhomogeneities;

said control and operating computer operating said radio-frequency system to make a 3D field measurement of said basic magnetic field in a one-time shimming procedure to obtain 3D field data representing said field inhomogeneities; and supplying said image data and said 3D field data for said slice to said control and processing system, and in said control and processing system reconstructing an image of said slice using said two-point Dixon technique, including interpolating said 3D field data over said slice and identifying a nose phase from said interpolation and correcting the phase values of said image data dependent on said residual phase offset obtained in said one-time shimming procedure.

13. A method as claimed in claim 12 wherein said scanner further comprises shim coils operated by a shim power supply, and wherein said method comprises homogenizing said basic magnetic field at least in said slice to a low order dependent on a shim coil current supplied to said shim coils by said shim power supply.

14. A method as claimed in claim 13 comprising, in said control and processing system, calculating said shim coil current, and controlling said shim power supply to generate said shim coil current, dependent on said 3D field data.

15. A method as claimed in claim 14 wherein said 3D field data comprise first 3D field data and wherein said method comprises, after homogenization to said low order of said basic magnetic field by said shim coils, operating said radio-frequency system from said control and processing system to again make a 3D field measurement of said basic magnetic field to obtain second 3D field data said second 3D field data representing higher order inhomogeneity of said basic magnetic field, and in said processing and control system, interpolating said image data using said second 3D field data to identify said residual phase offset and to correct said phase values of said image data.

16. A method as claimed in claim 14 wherein said 3D field data comprises first 3D field data and comprising, in said processing and control system, correcting said first 3D field data by a calculation dependent on said shim coil current and dependent on characteristics of said shim coils to obtain second 3D field data representing a basic magnetic field having inhomogeneities of a higher order, and correcting said phase values of said image data dependent on said second 3D field data.

17. A method as claimed in claim 12 wherein the step of operating said magnetic resonance scanner from said processing and control system comprises operating said magnetic resonance scanner according to a pulse sequence selected from the group consisting of a spin echo sequence and a gradient echo sequence, to obtain magnetic resonance signals for different spin ensembles having respectively different relative phase values.

18. A method as claimed in claim 17 comprises operating said magnetic resonance scanner to obtain said relative phase values of a first spin ensemble and a second spin ensemble.

19. A method as claimed in claim 18 comprising operating said magnetic resonance scanner to obtain at least two echoes, with the spins of said first ensemble being inphase in one of said two echoes and being anti-phase in the other of said two echoes.

20. A method as claimed in claim 19 comprising in said processing and control system, generating a pure image of said first spin ensemble in said slice by a mathematical operation performed on image data respectively from said two echoes selected from the group consisting of addition and subtraction.

21. A method as claimed in claim 20 wherein said first spin ensemble represents water and said second spin ensemble represents fat.

* * * * *